US 12,394,588 B2

United States Patent
Han

(10) Patent No.: US 12,394,588 B2
(45) Date of Patent: Aug. 19, 2025

(54) METHOD OF GENERATING A CRYSTALLINE ORIENTATION MAP OF A SURFACE PORTION OF A SAMPLE AND COMPUTER PROGRAM PRODUCT

(71) Applicant: Carl Zeiss Microscopy GmbH, Jena (DE)

(72) Inventor: Luyang Han, Heidenheim (DE)

(73) Assignee: Carl Zeiss Microscopy GmbH, Jena (DE)

(*) Notice: Subject to any disclaimer, the term of this patent is extended or adjusted under 35 U.S.C. 154(b) by 451 days.

(21) Appl. No.: 18/074,824

(22) Filed: Dec. 5, 2022

(65) Prior Publication Data
US 2023/0178332 A1 Jun. 8, 2023

(30) Foreign Application Priority Data
Dec. 8, 2021 (DE) .......................... 102021132340.1

(51) Int. Cl.
*H01J 37/22* (2006.01)
*H01J 37/20* (2006.01)
*H01J 37/28* (2006.01)

(52) U.S. Cl.
CPC ............ *H01J 37/222* (2013.01); *H01J 37/20* (2013.01); *H01J 37/28* (2013.01); *H01J 2237/20207* (2013.01); *H01J 2237/20214* (2013.01); *H01J 2237/221* (2013.01); *H01J 2237/2804* (2013.01)

(58) Field of Classification Search
USPC ........................................................ 250/307
See application file for complete search history.

(56) References Cited

U.S. PATENT DOCUMENTS

| 10,062,145 | B2 † | 8/2018 | Langlois |
| 2011/0108736 | A1 | 5/2011 | Preikszas |
| 2022/0373460 | A1* | 11/2022 | Gaskey ............. G01N 21/8851 |
| 2022/0412900 | A1* | 12/2022 | Han ........................ H01J 37/28 |

FOREIGN PATENT DOCUMENTS

DE    10 2009 052 392 A1    12/2011

OTHER PUBLICATIONS

German Office Action, with translation thereof, for corresponding DE application No. 10 2021 132 340.1 dated Aug. 30, 2022.

\* cited by examiner
† cited by third party

*Primary Examiner* — Kiet T Nguyen
(74) *Attorney, Agent, or Firm* — Fish & Richardson P.C.

(57) ABSTRACT

A method generates a crystalline orientation map of a surface portion of a sample. A crystalline orientation map represents crystalline orientations at a plurality of sample locations of the surface portion. The method comprises recording an image of the surface portion including a central location using particles of a charged particle beam directed to the surface portion and backscattering from the surface portion for each of a plurality of different orientation settings. Each of the orientation settings is defined by an azimuthal angle and an elevation angle under which the charged particle beam is incident onto the central location during the recording of the respective image. The method also includes generating the crystalline orientation map based on the recorded images.

22 Claims, 5 Drawing Sheets

METHOD OF GENERATING A CRYSTALLINE ORIENTATION MAP OF A SURFACE PORTION OF A SAMPLE AND COMPUTER PROGRAM PRODUCT

CROSS-REFERENCE TO RELATED APPLICATION

This application claims benefit under 35 U.S.C. § 119 to German Application No. 10 2021 132 340.1, filed Dec. 8, 2021. The contents of this application is hereby incorporated by reference in its entirety.

FIELD

The present disclosure relates to a method of generating a crystalline orientation map of a surface portion of a sample. A crystalline orientation map represents crystalline orientations at a plurality of sample locations of the surface portion. The crystalline orientation map can be obtained using a charged particle beam system such as an electron beam microscope having a data processing device for processing image data recorded using the charged particle beam system.

BACKGROUND

In conventional crystal orientation mapping, an electron beam is scanned over a grid of points on a sample and a diffraction image is detected at each point of the grid and stored. The diffraction image of a given point is analyzed to determine a crystalline orientation at the given point. The determined crystalline orientations at the points of the grid can be displayed as a crystal orientation map and processed to provide a wide variety of information about the sample microstructure such as grain boundaries, grain sizes, grain size distributions and the like.

However, this conventional approach can be time-consuming and memory-intense because a diffraction image (e.g., a two-dimensional spatial distribution) is detected and stored in memory for each point of the grid. Further, a detector for detecting the diffraction images is an expensive device.

SUMMARY

The present disclosure seeks to provide a faster and less memory-intense method for obtaining a crystalline orientation map of a surface portion of a sample.

An embodiment of the present disclosure relates to a method of generating a crystalline orientation map of a surface portion of a sample, wherein the surface portion includes a central location. The method comprises: recording an image of the surface portion using particles of a charged particle beam directed to the surface portion and backscattering from the surface portion for each of a plurality of different orientation settings, wherein each of the orientation settings is defined by an azimuthal angle and an elevation angle under which the charged particle beam is incident onto the central location during the recording of the respective image; and generating the crystalline orientation map based on the recorded images, wherein the crystalline orientation map represents crystalline orientations at a plurality of sample locations of the surface portion.

For example, when executing the method using a scanning electron microscope, the charged particle beam is an electron beam and the images are recorded from mainly backscattered electrons. However, the method can also be performed using an ion beam microscope.

The images are simple images of the surface portion of the sample. This means that each image location of the images represents a sample location of the surface portion of the sample, and each image location is assigned a (single) detection value based on the amount or detection rate or energy of the backscattered particles detected when directing the charged particle beam to the sample location represented by the respective image location. For example, the each of the images represents crystalline orientations at a plurality of scan locations (i. e., sample locations to which the charged particle beam is directed). In comparison to the conventional crystal orientation mapping, the images can be recorded fast and involve less memory to store.

The present disclosure further relates to a computer program product. The computer program product comprises computer instructions which, when executed by a computer, cause the computer to execute the methods disclosed herein. The computer program product can be a data storage such as compact disc, digital versatile disk and the like, the data storage can be read by the computer. The computer program product can be digital data. The digital data can be downloaded by the computer.

BRIEF DESCRIPTION OF THE DRAWINGS

Hereinafter, embodiments of the disclosure are described with reference to the accompanying drawings.

DETAILED DESCRIPTION

Figure 1:
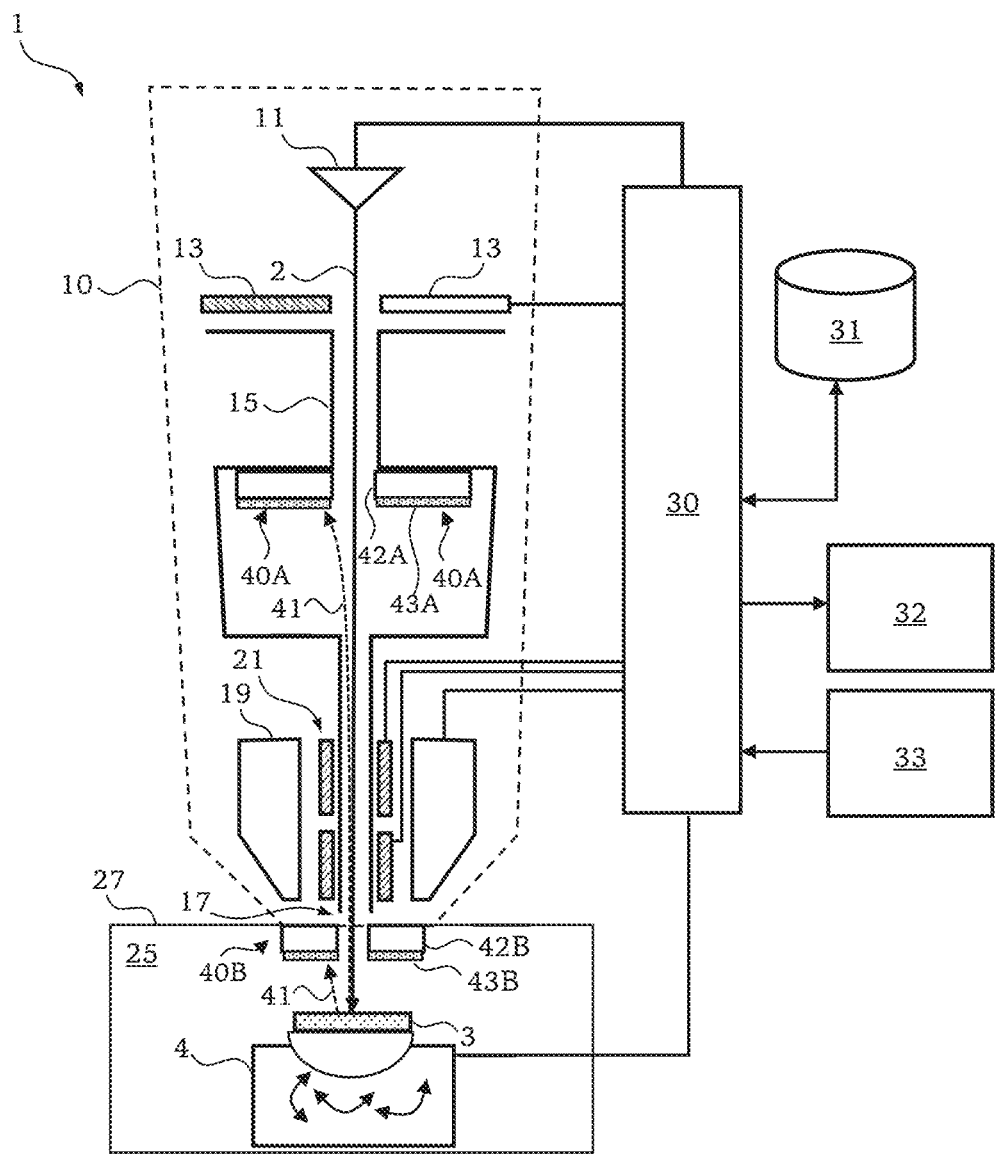
FIG. 1 shows a schematic illustration of a particle beam system.

FIG. 1 shows a schematic illustration of a particle beam system 1 suitable for executing the methods described herein. For example, the particle beam system 1 can be used to analyze a sample 3, for example to determine a crystalline orientation map of the sample 3.

The particle beam system 1 comprises a charged particle beam column 10. The charged particle beam column 10 comprises a charged particle source 11 configured to generate a charged particle beam 2 of charged particles (e.g., electrons or ions).

The charged particle beam column 10 further comprises an acceleration electrode 13. A selectable electric potential can be applied to the acceleration electrode 13 for accelerating the charged particles of the charged particle beam 2 to a selected kinetic energy.

The charged particle beam column 10 further comprises a beam tube 15 disposed downstream of the acceleration electrode 13. The charged particles of the charged particle beam 2 accelerated by the acceleration electrode 13 propagate inside the beam tube 15 and exit the beam tube 15 and the charged particle beam column 10 through an opening 17. A selectable electric potential can be applied to the beam tube 15.

The charged particle beam column 10 further comprises an objective lens 19 configured to focus the charged particle beam 2 on the sample 3. The objective lens 19 can be a magnetic and/or electrostatic lens, for example.

The charged particle beam column 10 further comprises a beam deflection system 21 configured to deflect the charged particle beam 2 so that the charged particle beam 2 can be directed to a plurality of sample locations of the sample 3. The beam deflection system 21 can be configured to deflect the charged particle beam 2 along two directions which are substantially perpendicular to each other and to an optical axis of the objective lens 19. In FIG. 1, the optical axis of the objective lens 19 is parallel to the vertical axis of FIG. 1 and located at a center of the objective lens 19. For this purpose, the beam deflection system 21 can comprise plural pairs of electrodes, each pair of electrodes being configured to deflect the charged particle beam 2.

Further, the beam deflection system 21 can be configured to displace the charged particle beam 2 in one or two directions perpendicular to the optical axis of the objective lens 19. For this purpose, multiple pairs of electrodes are distributed along the propagation path of the charged particle beam 2. As illustrated in FIG. 1, multiple pairs of electrodes are distributed along the optical axis of the objective lens 19 in order to provide a mechanism for displacing the charged particle beam 2 in a direction perpendicular to the optical axis of the objective lens 19.

The particle beam system 1 further comprises a vacuum chamber 25. The vacuum chamber 25 has a chamber wall 27 defining the vacuum chamber 25. A vacuum can be generated inside the vacuum chamber 25. The vacuum chamber 25 is connected to the charged particle beam column 10 at the opening 17 so that the charged particle beam 2 can enter the vacuum chamber 25 through the opening 17.

The particle beam system 1 further comprises a sample stage 4 holding the sample 3. The sample stage 4 can be configured to displace the sample 3 in multiple directions. The sample stage 4 can be configured to rotate the sample 3 about multiple axis of rotation. For example, the sample stage 4 can be configured to rotate the sample 3 about two or three axes of rotation. For example, the axes of rotation can be orthogonal to each other. The sample stage 4 is located inside the vacuum chamber 25.

The particle beam system 1 further comprises a controller 30 configured to control all components of the particle beam system 1. For example, the controller 30 can control the charged particle beam column 10 and the sample stage 4. Specifically, the controller 30 can control the charged particle source 11, the electric potential applied to the acceleration electrode 13, the electric potential applied to the beam tube 15, the objective lens 19 and the beam deflection system 21.

The particle beam system 1 further comprises a data memory 31 configured to store data. The controller 30 can read data from the data memory 31 and write data into the data memory 31.

The particle beam system 1 further comprises an output device 32 configured to output information. For example, the output device 32 can be a display device for displaying information provided by the controller 30.

The particle beam system 1 further comprises an input device 33 for providing user instructions to the controller 30. The input device 33 can comprise a mouse, a keyboard and the like, for example.

The particle beam system 1 further comprises a detection system 40A configured to detect backscattered particles 41 emerging from the sample 3 due to interaction of the charged particle beam 2 with the sample 3. The backscattered particles 41 emerging from the sample 3 can be backscattered electrons or backscattered ions, for example. For detecting the backscattered particles 41, the detection system 40A comprises a detector 42A having a detection area 43A. The detection area 43A is arranged to face the sample 3. The detector 42A is located inside the beam tube 15 between the acceleration electrode 13 and the objective lens 19. The detector 42A is located on the same side of the sample 3 as the incident charged particle beam 2. The detector 42A is configured to output a detection signal representing an amount or a detection rate or an energy of the backscattered particles 41 incident onto the detection area 43A. The detector 42A can be a simple counter counting the amount of the backscattered particles 41 incident onto the detection area 43A irrespective of the specific location of incidence onto the detection area 43A. That is, the detector 42A does not have to be an image sensor which provides a spatially resolved information. The controller 30 receives the detection signal for further processing and evaluation.

The detector 42A can be a segmented detector having a plurality of detection segments, wherein each of the segments outputs a detection signal representing an amount or detection rate or energy of the backscattered particles 41 incident onto the respective detection segment. For example, the detector 42A can have up to 10 segments. However, for the purpose of the present disclosure, the spatially resolved information provided by the plurality of detection signals is, in general, neither required nor used.

The particle beam system 1 can comprise another or a different detection system for detecting backscattered particles 41 emerging from the sample 3 due to interaction of the charged particle beam 2 with the sample 3. For example, the particle beam system 1 can comprise a detection system 40B configured to detect backscattered particles 41 emerging from the sample 3 due to interaction of the charged particle beam 2 with the sample 3. For detecting the backscattered particles 41, the detection system 40B comprises a detector 42B having a detection area 43B. The detection area 43B is arranged to face the sample 3. The detection system 40B can be displaced or displaceable downstream of the objective lens 19, i.e., between the objective lens 19 and the sample 3. The detection system 40B is located on the same side of the sample 3 as the incident charged particle beam 2. The detection system 40B is configured to output a detection signal representing an amount or detection rate or energy of the backscattered particles 41 incident onto the detection area 43B.

Figure 2:
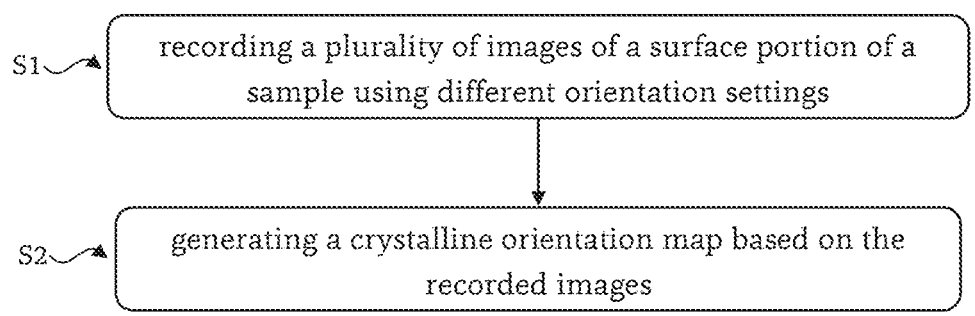
FIG. 2 shows a flowchart of a method of generating a crystalline orientation map of a surface portion of a sample.

FIG. 2 shows a flowchart of a method of generating a crystalline orientation map of a surface portion S of a sample 3. In step S1, a plurality of images of the surface portion S of the sample 3 is recorded using different orientation settings $OS_n$. Here, $OS_n$ represents the orientation setting used for recording an n-th of N images, where N is an integer greater one. Thus, the n-th image is recorded using the n-th orientation setting $OS_n$, wherein n ranges from 1 to N. That is, each of the N images is recorded using a unique orientation setting $OS_n$ which is different from the orientation settings $OS_{m \neq n}$ used for recording all other images.

Figure 3:
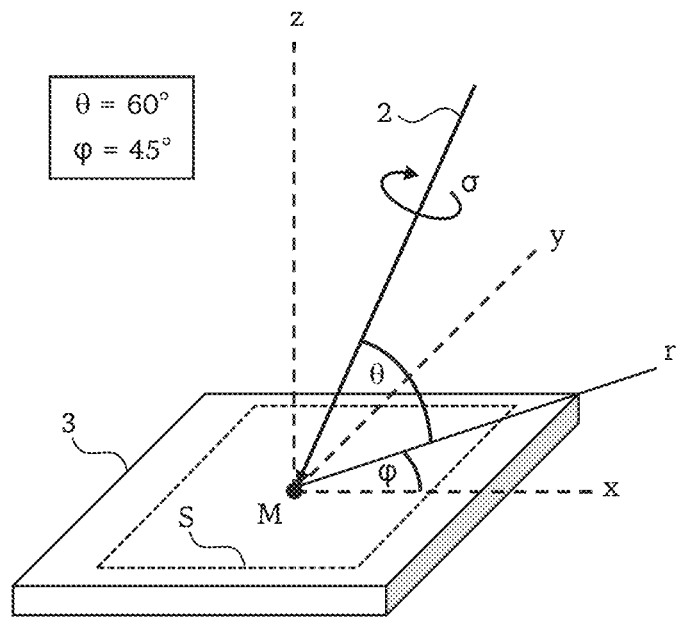
FIG. 3 shows a schematic illustration of an orientation setting.

FIG. 3 shows a schematic illustration of an exemplary orientation setting. The orientation setting is defined by an azimuthal angle $\varphi$ and an elevation angle $\theta$ under which the charged particle beam 2 is incident onto a central location M of the surface portion S during the recording of the respective image. The orientation setting can include a third angle σ. The third angle σ can represent the orientation of the sample 3 about a direction of the charged particle beam 2 at the central location M. Alternatively, the third angle σ can represent a polarization of the charged particle beam 2. However, as the charged particle beam 2 is generally non-polarized, the third angle σ can be neglected in many cases.

The azimuthal angle φ describes an angle in a horizontal plane x-y of the surface portion S (with reference to an arbitrary reference) under which the charged particle beam 2 is incident onto the central location M. The horizontal plane x-y is spanned by an x-axis and a y-axis perpendicular to the x-axis. The horizontal plane is a tangential plane for the central location M. In the example illustrated in FIG. 3, the reference defining φ=0° is the x-axis. The azimuthal angle φ ranges from 0° to 360°.

The elevation angle θ describes an angle between the charged particle beam 2 incident onto the central location M and the horizontal plane x-y of the surface portion S. That is, the elevation angle θ describes the angle between the propagation direction of the charged particle beam 2 at the central location M and a direction r, wherein the direction r lies in the horizontal plane x-y of the surface portion S and represents the projection of the propagation direction of the charged particle beam 2 at the central location M onto the horizontal plane x-y of the surface portion S. The elevation angle θ ranges from 0° to 90°, wherein an elevation angle of 90° means perpendicular incidence of the charged particle beam 2 onto the central location M of the surface portion S.

In the example illustrated in FIG. 3, θ=60° and φ=45°, for the purpose of illustration only.

The orientation settings fulfill at least one constraint of a group of constraints. The group of constraints comprises: the elevation angles of the orientation settings are different from each other. The group of constraints further comprises: the azimuthal angles of the orientation settings are different from each other. The group of constraints further comprises: the orientation settings have different azimuthal angles and elevation angles different from 90°. The azimuthal angles are defined to be different if the difference between them is at least 0.1° or at least 0.5° or at least 1°. The elevation angles are defined to be different if the difference between them is at least 0.1° or at least 0.5° or at least 1°.

Figure 4:
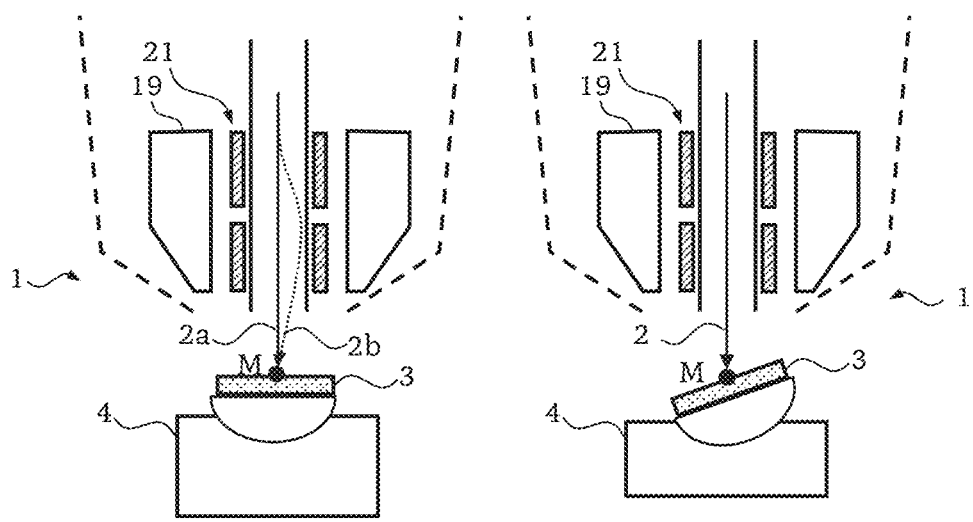
FIG. 4 schematically shows two ways for selecting an orientation setting.

FIG. 4 schematically shows two ways for selecting the orientation setting. As illustrated on the left side of FIG. 4, the orientation setting can be selected by (double) deflecting the charged particle beam 2. For example, referring to the particle beam system 1 illustrated in FIG. 1 and the left side of FIG. 4, the deflecting of the charged particle beam 2 can be performed by the controller 30 controlling the beam deflection system 21.

As illustrated on the right side of FIG. 4, additionally or alternatively, the orientation setting can be selected by changing the orientation of the sample stage 4. For example, referring to the particle beam system 1 illustrated in FIG. 1 and the right side of FIG. 4, the deflecting of the charged particle beam 2 can be performed by the controller 30 controlling the sample stage 4 to tilt and/or rotate.

The images can be recorded at substantially perpendicular incidence of the charged particle beam 2 onto the surface portion S to be imaged. For example, the elevation angles of the orientation settings used for recording all the images can be limited to values greater than 80°.

The recording of each of the images can comprise: selecting, among the orientation settings, the respective orientation setting not previously used to record any of the images; directing the charged particle beam successively to a plurality of scan locations on the surface portion while maintaining the selected respective orientation setting; and storing a detection value for each of the plurality of scan locations, wherein the detection value is based on an amount or detection rate or energy of the backscattered particles detected during the directing of the charged particle beam to the respective scan location.

That is, each single image is recorded by directing the charged particle beam 2 to a plurality of scan locations. During the directing of the charged particle beam 2 to a given scan location of the plurality of scan locations, particles 41 backscattering from the sample 3 are detected, for example, using the detector 42A, 42B illustrated in FIG. 1. The detector 42A, 42B outputs a detection signal representing an amount or detection rate or energy of the detected backscattered particles 41 associated with the given scan location. The controller 30 stores a detection value I associated with the given scan location (x, y) into the data memory 31, wherein the detection value represents the information provided by the detection signal, e.g., the detection value represents the amount or detection rate or energy of the detected backscattered particles 41. Each of the N images is a collection of the detection values I and their associated scan locations (x, y). Thus, the detection value at the scan location (x, y) is referred to as I(x, y); and an image n (ranging from 1 to N, where N is an integer greater one) is stored as data $I_n(x, y)$.

Figure 5A:
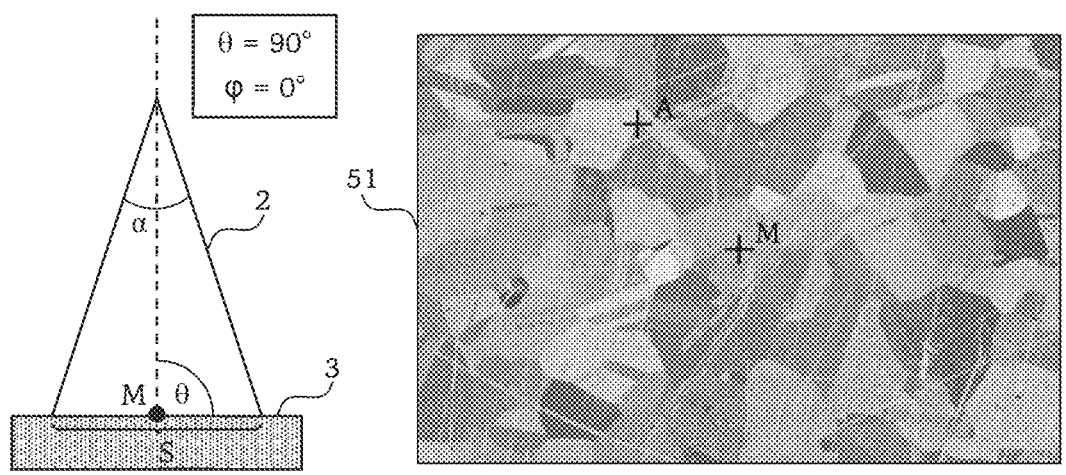
FIGS. 5A to 5C show examples of different orientation settings and exemplary images obtained using the different orientation settings.
Figure 5B:
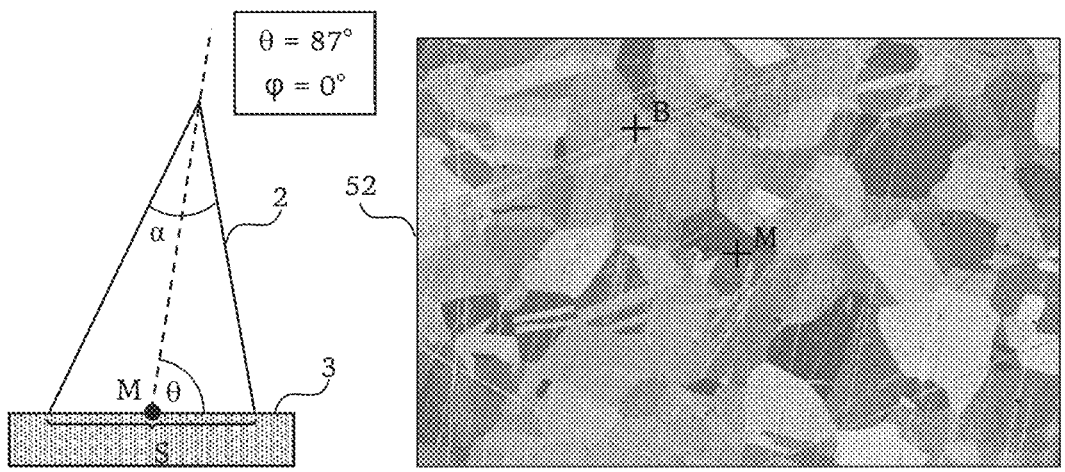
Figure 5C:
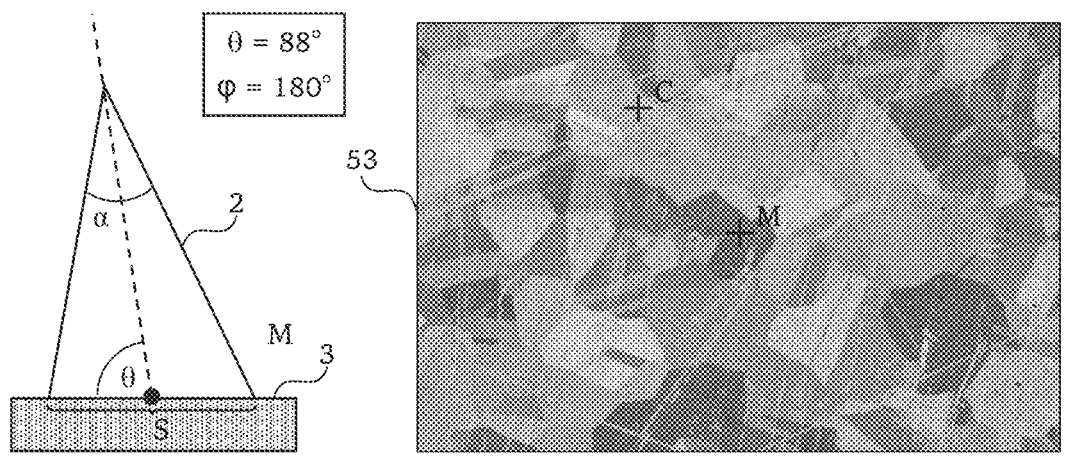

FIGS. 5A to 5C show examples of different orientation settings and exemplary images obtained using the different orientation settings.

FIG. 5A shows a recorded image 51 obtained using the orientation setting of θ=90° and φ=0°. The image 51 represents the amount of detected backscattered particles for a plurality of scan locations of the surface portion S of the sample 3. The image 51 is a grayscale image and shows a plurality of crystalline grains of a polished stainless steel sample by contrast. Like gray values in the image 51 indicate like crystalline orientations. Different gray values in the image 51 indicate different crystalline orientations. An exemplary sample location of the image 51 is indicated "A".

The orientation setting of θ=90° and φ=0° is sketched on the left side of FIG. 5A. As illustrated in the sketch, the charged particle beam 2 is scanned over the sample 3 using a scanning angle α in order to direct the charged particle beam 2 to the plurality of scan locations of the surface portion S. Thereby, the charged particle beam 2 is incident onto the central location M at θ=90° and φ=0°.

FIG. 5B shows a recorded image 52 obtained using the orientation setting of θ=87° and φ=0°. The orientation setting of θ=87° and φ=0° is sketched on the left side of FIG. 5B.

As illustrated in the sketch, the charged particle beam 2 is scanned over the sample 3 using a scanning angle α (might be different from that of the orientation setting of θ=90° and φ=0°) in order to direct the charged particle beam 2 to a plurality of scan locations of the surface portion S. Thereby, the charged particle beam 2 is incident onto the central location M at θ=87° and φ=0°. A sample location indicated "B" in the image 52 represents the same sample location as the sample location indicated "A" in the image 51.

FIG. 5C shows a recorded image 53 obtained using the orientation setting of θ=88° and φ=180°. The orientation setting of θ=88° and φ=180° is sketched on the left side of FIG. 5C. As illustrated in the sketch, the charged particle beam 2 is scanned over the sample 3 using a scanning angle α (might be different from that of the orientation setting of θ=90° and φ=0° and of the orientation setting of θ=87° and φ=0°) in order to direct the charged particle beam 2 to a plurality of scan locations of the surface portion S. Thereby, the charged particle beam 2 is incident onto the central location M at θ=88° and φ=180°. A sample location indicated "C" in the image 53 represents the same sample location as the sample locations indicated "A" in the image 51 and indicated "B" in the image 52.

Although showing the same surface portion S of the same sample 3, the images 51 to 53 show differences in contrast. For example, it can be observed that the contrast can be significantly different when observing the sample under slightly different orientation settings. Some areas that show homogenous gray levels in one image (i.e. one orientation setting) will show significantly varying gray levels in another image (i.e. another orientation setting). Features that can be observed clearly in one image may not be observable in another image. This effect is due to "channeling" of the particles of the charged particle beam 2. This effect occurs for a narrow range of angular configurations between the propagation direction of the particle beam 2 and the local crystalline orientation of the sample 3. According to this effect, the particles of the charged particle beam 2 can penetrate deeply into the sample 3, thus having a small backscattering cross-section which results in dark regions in the images.

In order to utilize this influence of the orientation setting, according to step S2 of the method illustrated in FIG. 2, the crystalline orientation map 54 is generated using the plurality of recorded images 51 to 53.

Figure 6:
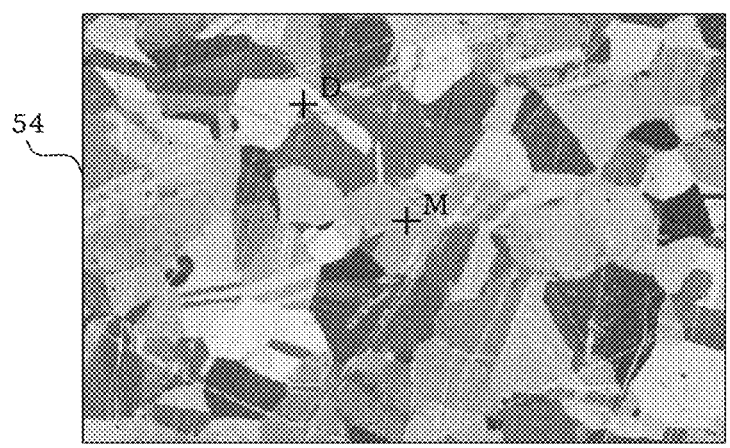
FIG. 6 shows an image of an exemplary crystalline orientation map generated from the images illustrated in FIGS. 5A to 5C.

FIG. 6 shows a grayscale representation of a color image of an exemplary crystalline orientation map 54 generated from the images 51 to 53 illustrated in FIGS. 5A to 5C. Due to legal restrictions, colored images were not admissible in patent applications at the date of filing of the present patent application. Because of that, FIG. 6 shows a grayscale representation of the color image.

The color image of the exemplary crystalline orientation map 54 consists of a plurality of colored areas, wherein adjacent areas have different colors. Each of the areas represents a sample region having a homogeneous crystalline orientation defined by the combination of detection values of the recorded images 51 to 53 for that sample region. The color image of the crystalline orientation map 54 represents crystalline orientations by colors. That is, different colors represent different crystalline orientations. A sample location indicated by "D" is the same sample location as those indicated "A", "B", "C" in images 51 to 53.

Each image location of the color image represents a sample location of the surface portion S of the sample 3. Each image location is assigned a color value representing the crystalline orientation of the sample at the sample location represented by the respective image location. The color value at a given image location representing a given sample location can be determined using values of the recorded images 51 to 53 associated with the given sample location. That is, for example, the color value at a given image location representing a given sample location (x, y) can be determined using the detection values $I_n(x, y)$ of the N images at the given same sample location (x, y). For example, the color value at sample location D can be determined using the detection values of the images 51 to 53 at the same sample locations "A" to "C".

The representation of the crystalline orientation map 54 as a color image is an example of how to synthesize the images 51 to 53. Many kinds of representations based on the images 51 to 53 can be used to represent the crystalline orientation map 54. The representation should represent like crystalline orientations by like representation features (e.g., colors, brightness, saturation, hatchings or symbols such as numbers, characters, character strings, etc.).

Any kind of mapping can be applied which uniquely maps the detection values of the recorded images to a representation feature. Hereinafter, examples of mappings of the detection values of the images 51 to 53 to a representation feature are described.

As an example, the crystalline orientation map 54 is represented as a color image comprising a plurality of pixels, and a color value of each of the pixels is defined by a triplet, such as an RGB-triplet, wherein "R" represents a red contribution, "G" represents a green contribution and "B" represents a blue contribution to the color value. The mapping of the detection values of the three images 51 to 53 to the color values of the crystalline orientation map 54 can be as follows: The "R"-contribution is provided by the detection values of the image 51; the "G"-contribution is provided by the detection values of the image 52; and the "B"-contribution is provided by the detection values of the image 53. Accordingly, each color value (defined by the RGB-triplet) is based on the detection values of the images 51 to 53.

According to another example, the mapping of the detection values of the three images 51 to 53 to the representation features of the crystalline orientation map 54 can be as follows: Each combination of detection values representing a same sample location (e. g., the detection values of the images 51 to 53 at the sample locations "A" to "C") is assigned a unique representation feature.

The above-described method according to the disclosure can be performed much faster than the conventional crystal orientation mapping. According to the method according to the disclosure, a plurality of simple images of the sample region to be represented by the crystalline orientation map is recorded; according to the conventional crystal orientation mapping described at the beginning, a plurality of diffraction images is recorded for each pixel of the crystalline orientation map. Thus, compared to the conventional crystal orientation mapping described at the beginning, the method according to the disclosure involves less image recording, thereby reducing the overall time duration for obtaining a crystalline orientation map. However, the crystalline orientation map provided by the conventional crystal orientation mapping provides quantitative results, whereas the method according to the disclosure provides qualitative results only. The qualitative information can be used to analyze the sample in terms of number of grains, grain size, and the like.

In order to generate the crystalline orientation map 54, it might be desirable to identify the same sample locations in the recorded images because the images might have different contrast and might be distorted (due to their recording using different orientation settings) or because of other influences such as sample stage drift and the like. Therefore, the generating of the crystalline orientation map can comprise identifying same sample locations in the recorded images.

Providing the values of the recorded images at the same sample locations can be performed by reading the respective data from the data memory 31. Providing the values of the recorded images at the same sample locations can comprise interpolation of the detection values of the images to obtain a calculated detection value at a desired sample location. This can be desirable if the scan locations do not sufficiently coincide with the desired sample locations for the crystalline orientation map.

Because the images are recorded using different orientation settings, the images might be distorted slightly. In order to simplify identification of the same sample locations in the recorded images, the generating of the crystalline orientation map can comprise compensating distortion between the images. The compensating may be performed based on the orientation settings, i.e. based on the different angles under which the images are recorded and the consequent theoretical distortion caused thereby.

Further, in order to simplify identification of the same sample locations in the images, the generating of the crystalline orientation map can comprise tracking features in the images during the recording of the images and/or correlating the images.

In the above example, three images 51 to 53 are recorded and used to generate the crystalline orientation map 54. However, the crystalline orientation map can also be generated using two images. Also, the crystalline orientation map can be generated using four or more images.

The generated crystalline orientation map 54 can be displayed to a user, for example using the output device 32 illustrated in FIG. 1.

In some implementations, the controller 30 can include one or more data processors for processing data, one or more storage devices for storing data, and/or one or more computer programs including instructions that when executed by the controller 30 cause the controller 30 to carry out the processes described above.

In some implementations, the controller 30 can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document.

Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

What is claimed is:

1. A method of generating a crystalline orientation map of a surface portion of a sample, the surface portion comprising a central location, the method comprising:
    recording an image of the surface portion using particles of a charged particle beam directed to the surface portion and backscattering from the surface portion for each of a plurality of different orientation settings, wherein each of the orientation settings is defined by an azimuthal angle and an elevation angle under which the charged particle beam is incident onto the central location during the recording of the respective image; and
    generating the crystalline orientation map based on the recorded images,
    wherein the crystalline orientation map represents crystalline orientations at a plurality of sample locations of the surface portion.

2. The method of claim 1, wherein recording each of the images comprises:
    selecting, among the orientation settings, a respective orientation setting not previously used to record any of the images;
    directing the charged particle beam successively to a plurality of scan locations on the surface portion while maintaining the selected respective orientation setting; and
    storing a detection value for each of the plurality of scan locations, wherein the detection value is based on an amount or detection rate or energy of the backscattered particles detected when directing the charged particle beam to the respective scan location.

3. The method of claim 2, wherein selecting the orientation setting comprises deflecting the charged particle beam.

4. The method of claim 3, wherein selecting the orientation setting further comprises changing an orientation of a sample stage holding the sample.

5. The method of claim 4, wherein the different orientation settings fulfill at least one constraint selected from the group consisting of:
    (I) the elevation angles of the orientation settings are different from each other;
    (II) the azimuthal angles of the orientation settings are different from each other; and
    (III) the orientation settings have different azimuthal angles and elevation angles different from 90°.

6. The method of claim 5, wherein the elevation angles of the orientation settings are limited to values greater than 80°.

7. The method of claim 6, wherein the crystalline orientation map is a color image representing the crystalline orientations by colors.

8. The method of claim 7, wherein generating the crystalline orientation map comprises determining a color-value for each of the plurality of sample locations, the color-value at a respective sample location being determined using values at the respective sample location of the images.

9. The method of claim 8, wherein generating the crystalline orientation map comprises at least one member selected from the group consisting of:
    compensating distortion between the images;
    tracking features in the images when recording the images to determine same sample locations in the images; and
    correlating the images to determine the same sample locations in the images.

10. The method of claim 9, further comprising displaying the generated crystalline orientation map as an image.

11. The method of claim 10, wherein the charged particle beam is an electron beam and the images are recorded from mainly backscattered electrons.

12. The method of claim 2, wherein selecting the orientation setting comprises changing an orientation of a sample stage holding the sample.

13. The method of claim 1, wherein selecting the orientation setting further comprises changing an orientation of a sample stage holding the sample.

14. The method of claim 1, wherein the different orientation settings fulfill at least one constraint selected from the group consisting of:
 (I) the elevation angles of the orientation settings are different from each other;
 (II) the azimuthal angles of the orientation settings are different from each other; and
 (III) the orientation settings have different azimuthal angles and elevation angles different from 90°.

15. The method of claim 1, wherein the elevation angles of the orientation settings are limited to values greater than 80°.

16. The method of claim 1, wherein the crystalline orientation map is a color image representing the crystalline orientations by colors.

17. The method of claim 1, wherein generating the crystalline orientation map comprises determining a color-value for each of the plurality of sample locations, the color-value at a respective sample location being determined using values at the respective sample location of the images.

18. The method of claim 1, wherein generating the crystalline orientation map comprises at least one member selected from the group consisting of:
 compensating distortion between the images;
 tracking features in the images when recording the images to determine same sample locations in the images; and
 correlating the images to determine the same sample locations in the images.

19. The method of claim 1, further comprising displaying the generated crystalline orientation map as an image.

20. The method of claim 1, wherein the charged particle beam is an electron beam and the images are recorded from mainly backscattered electrons.

21. One or more machine-readable hardware storage devices comprising instructions that are executable by one or more processing devices to perform operations comprising the method of claim 1.

22. A system, comprising:
 one or more processing devices; and
 one or more machine-readable hardware storage devices comprising instructions that are executable by the one or more processing devices to perform operations comprising the method of claim 1.

* * * * *

UNITED STATES PATENT AND TRADEMARK OFFICE
CERTIFICATE OF CORRECTION

| | | |
|---|---|---|
| PATENT NO. | : 12,394,588 B2 | Page 1 of 1 |
| APPLICATION NO. | : 18/074824 | |
| DATED | : August 19, 2025 | |
| INVENTOR(S) | : Luyang Han | |

It is certified that error appears in the above-identified patent and that said Letters Patent is hereby corrected as shown below:

In the Specification

Column 4, Line 57, delete "Nis" and insert -- N is --.

Signed and Sealed this
Thirtieth Day of September, 2025

John A. Squires
*Director of the United States Patent and Trademark Office*